(12) United States Patent
Huang et al.

(10) Patent No.: US 11,094,579 B2
(45) Date of Patent: Aug. 17, 2021

(54) METHOD OF FORMING SHALLOW TRENCH ISOLATION STRUCTURE

(71) Applicant: TAIWAN SEMICONDUCTOR MANUFACTURING COMPANY, LTD., Hsinchu (TW)

(72) Inventors: Yen-Bin Huang, Hsinchu (TW); Chien-Mao Chen, Zhubei (TW); Yu-Hsuan Kuo, Taipei (TW); Shih-Kai Fan, Hsinchu (TW); Chia-Hung Lai, Hsinchu (TW); Kang-Min Kuo, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/883,204

(22) Filed: May 26, 2020

(65) Prior Publication Data

US 2020/0286774 A1  Sep. 10, 2020

Related U.S. Application Data

(62) Division of application No. 13/945,608, filed on Jul. 18, 2013, now Pat. No. 10,699,938.

(51) Int. Cl.
*H01L 21/762* (2006.01)
*H01L 21/3065* (2006.01)
(Continued)

(52) U.S. Cl.
CPC .... *H01L 21/76232* (2013.01); *H01L 21/3065* (2013.01); *H01L 21/3083* (2013.01); *H01L 21/30608* (2013.01)

(58) Field of Classification Search
CPC ......... H01L 29/66795; H01L 21/76224; H01L 29/0649; H01L 21/76229; H01L 21/76264; H01L 21/76267; H01L 21/76283
See application file for complete search history.

(56) References Cited

U.S. PATENT DOCUMENTS

| H204 H | 2/1987 | Oh |
| 6,235,610 B1 * | 5/2001 | Nicotra ................. H01L 21/266 257/E21.346 |

(Continued)

*Primary Examiner* — Marcos D. Pizarro
*Assistant Examiner* — Quinton A Brasfield
(74) *Attorney, Agent, or Firm* — Hauptman Ham, LLP

(57) ABSTRACT

A method of forming a semiconductor structure includes depositing a mask layer over a substrate. The method includes etching the substrate to define a first opening. The method includes depositing a sacrificial material in the first opening. The method includes depositing a dielectric liner along sidewalls of the first opening, wherein a bottom surface of the dielectric liner contacts the sacrificial material. The method includes removing the sacrificial material. The method includes etching the substrate to enlarge the first opening to define a second opening. The second opening includes a first portion extending a first depth from the dielectric material in a first direction perpendicular to a top surface of the substrate, and a second portion extending in a second direction, parallel to the top surface of the substrate. The method includes removing the dielectric liner. The method includes filling the second opening with a dielectric material.

20 Claims, 3 Drawing Sheets

(51) Int. Cl.
    *H01L 21/306*     (2006.01)
    *H01L 21/308*     (2006.01)

(56) References Cited

U.S. PATENT DOCUMENTS

| | | | |
|---|---|---|---|
| 6,255,689 B1 | 7/2001 | Lee | |
| 6,294,419 B1 * | 9/2001 | Brown | H01L 21/76232 |
| | | | 257/E21.549 |
| 6,313,008 B1 * | 11/2001 | Leung | H01L 21/76232 |
| | | | 257/510 |
| 8,120,094 B2 * | 2/2012 | Liaw | H01L 21/823878 |
| | | | 257/328 |
| 8,936,995 B2 | 1/2015 | Tilke | |
| 2014/0021526 A1 | 1/2014 | Yao | |
| 2014/0094009 A1 * | 4/2014 | Chih | H01L 21/823412 |
| | | | 438/231 |

\* cited by examiner

METHOD OF FORMING SHALLOW TRENCH ISOLATION STRUCTURE

RELATED APPLICATIONS

This application is a divisional application of U.S. application Ser. No. 13/945,608, filed Jul. 18, 2013, the entire contents of which are hereby incorporated by reference.

TECHNICAL FIELD

This disclosure relates generally to a semiconductor structure and, more particularly, to a shallow trench isolation structure and method of forming a shallow trench isolation structure.

BACKGROUND

Shallow trench isolation (STI) structure is an isolation technology in an Integrated circuit (IC) device. One of the purposes of STI is to prevent carriers, such as electrons or electron-holes, from drifting between two adjacent device elements through a semiconductor substrate to cause a current leakage.

Integrated circuit technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices.

Due to device scaling, improvements to IC devices are continually being made to further improve STIs.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a semiconductor structure having a shallow trench isolation (STI) structure is formed within a chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

FIGS. 1A to 1H are cross-sectional views of a semiconductor structure 200 having a STI structure at various stages of manufacture according to various embodiments of this disclosure. Additional processes may be provided before, during, or after FIGS. 1A to 1H. Various figures have been simplified for a better understanding of the inventive concepts of the present disclosure.

Figure 1B:
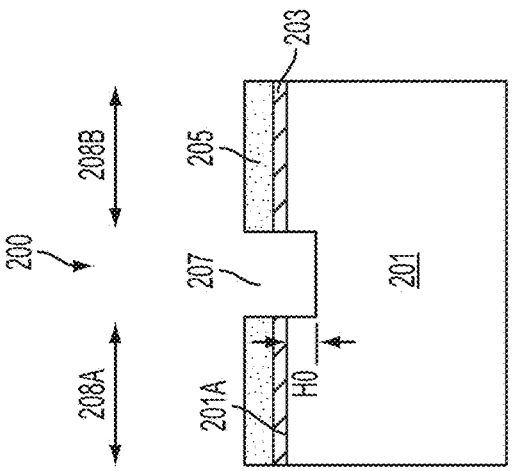
FIGS. 1A to 1H are cross-sectional views of semiconductor structures having a shallow trench isolation structure at various stages of manufacture according to one or more embodiments of this disclosure.
Figure 1D:
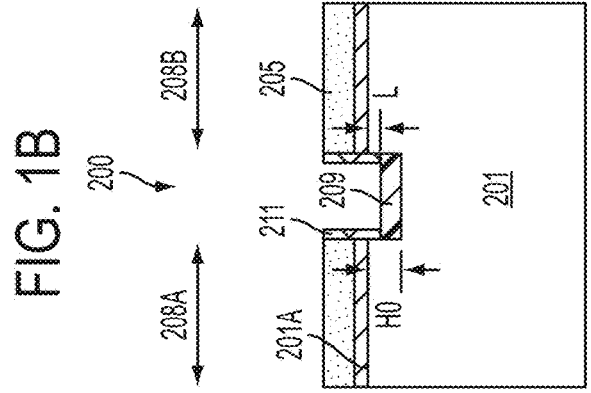
Figure 1A:
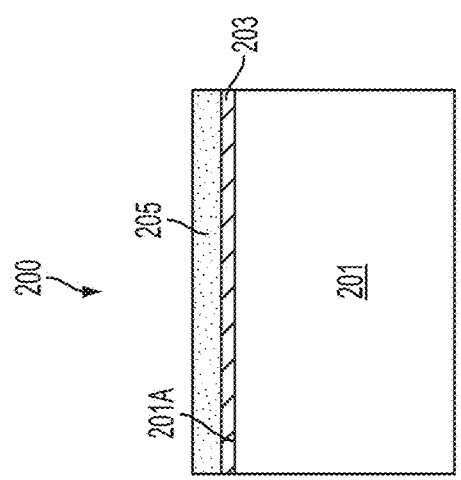

Referring to FIG. 1A, which is an enlarged cross-sectional view of a portion of the semiconductor structure 200 having a STI structure. The semiconductor structure 200A includes a substrate 201 such as a silicon carbide (SiC) substrate, GaAs, InP or Si/Ge. In the examples in FIGS. 1A-1H, the substrate 201 is a silicon substrate. The substrate 201 has a first surface 201A. A pad dielectric layer 203, for example an oxide layer, is formed over the first surface 201A by a chemical vapor deposition (CVD) or a thermal oxidation process. The pad dielectric layer 203 is a thin layer and may reduce the stress of the later formed masking layer 205 and the substrate 201. In some examples, the pad dielectric layer 203 has a thickness in a range substantially from 3 nm to 20 nm.

A masking layer 205 is formed over the pad dielectric layer 203. The masking layer 205 may comprise silicon nitride, oxynitrides or silicon carbide. The masking layer 205 may be formed by plasma enhanced chemical vapor deposition (PECVD), low pressure chemical vapor deposition (LPCVD), or other suitable processes. In some examples, the masking layer 205 has a thickness in a range substantially from 80 nm to 200 nm.

Referring to FIG. 1B, which is a cross-sectional view of a portion of the semiconductor structure 200 after a first opening 207 is formed in the substrate 201. In some examples, the masking layer 205 and the pad dielectric layer 203 are patterned through suitable photolithographic and etching processes to expose a portion of the substrate 201. Once the masking layer 205 has been patterned, the exposed portion of the substrate 201 is removed to form the first opening 207. The first opening 207 extends from the first surface 201A with a depth $H_0$ into the substrate 201. In some embodiments, the depth $H_0$ is in a range substantially from 200 nm to 300 nm. The first opening 207 includes a sidewall surface and a bottom surface. The first opening 207 is formed by a suitable process such as reactive ion etching (RIE) to remove the exposed portion of the substrate 201. The first opening 207 separates two adjacent active regions 208A and 208B.

The active regions 208A-B are electrically conductive regions of the substrate 201 adjacent to the first surface 201A of the substrate 201. The active regions 208A-B will be used for components of semiconductor devices (such as transistors, resistors, diodes, etc.) to be formed later. The active regions 208A-B may be implanted with suitable materials into the crystal substrate in later processes. Depending upon the materials chosen, the active regions 208A-B may comprise either an n-well or a p-well, as determined by the design considerations.

Figure 1C:
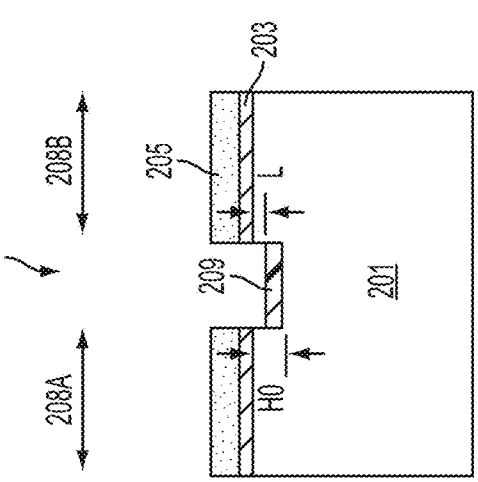

Referring to FIG. 1C, a sacrificial material 209 is partially filled in a bottom portion of the first opening 207. The sacrificial material 209 has a different etching resistance compared to the masking layer 205. The sacrificial material 209 could be selectively removed and leaves the masking layer 205 remained in the later process. In certain examples, the sacrificial material 209 includes an oxide layer. In some examples, the sacrificial material 209 is filled in the bottom portion of the first opening 20 with a thickness in a range substantially from 5 nm to 30 nm. A top surface of the sacrificial material 209 is lower than the first surface 201A of the substrate 201 (also lower than a top of the first opening 207). The sidewall surface of the first opening 207 not filled by the sacrificial material 209 has a length L in a direction vertical to the first surface 201A. In some embodiments, the length L of the exposed sidewall surface of the first opening 207 is in a range substantially from 200 nm to 300 nm.

Referring to FIG. 1D, a dielectric liner 211 is formed over the exposed sidewall surface of the first opening 207. The dielectric liner 211 is also over sidewall surfaces of the patterned masking layer 205 and pad dielectric layer 203. The dielectric liner 211 covers the length L of the exposed sidewall surface of the first opening 207. The dielectric liner 211 has a different etching resistance compared to the sacrificial material 209. The sacrificial material 209 could be selectively removed and the dielectric liner 211 is remained in the later process. In certain examples, the dielectric liner 211 includes a nitride layer. The dielectric liner 211 may be formed by plasma enhanced chemical vapor deposition (PECVD), high aspect ratio process (HARP) deposition, or other suitable processes. In some embodiments, a dielectric material is conformally deposited over the masking layer 205, along the sidewall surface of the patterned masking layer 205 and pad dielectric layer 203, along the exposed sidewall surface of the first opening 20, and over the top surface of the sacrificial material 209. The dielectric material is anisotropically etched without lithography patterning process to form the dielectric liner 211 along the sidewall surface of the patterned masking layer 205 and pad dielectric layer 203, and along the exposed sidewall surface of the first opening 207.

Figure 1F:
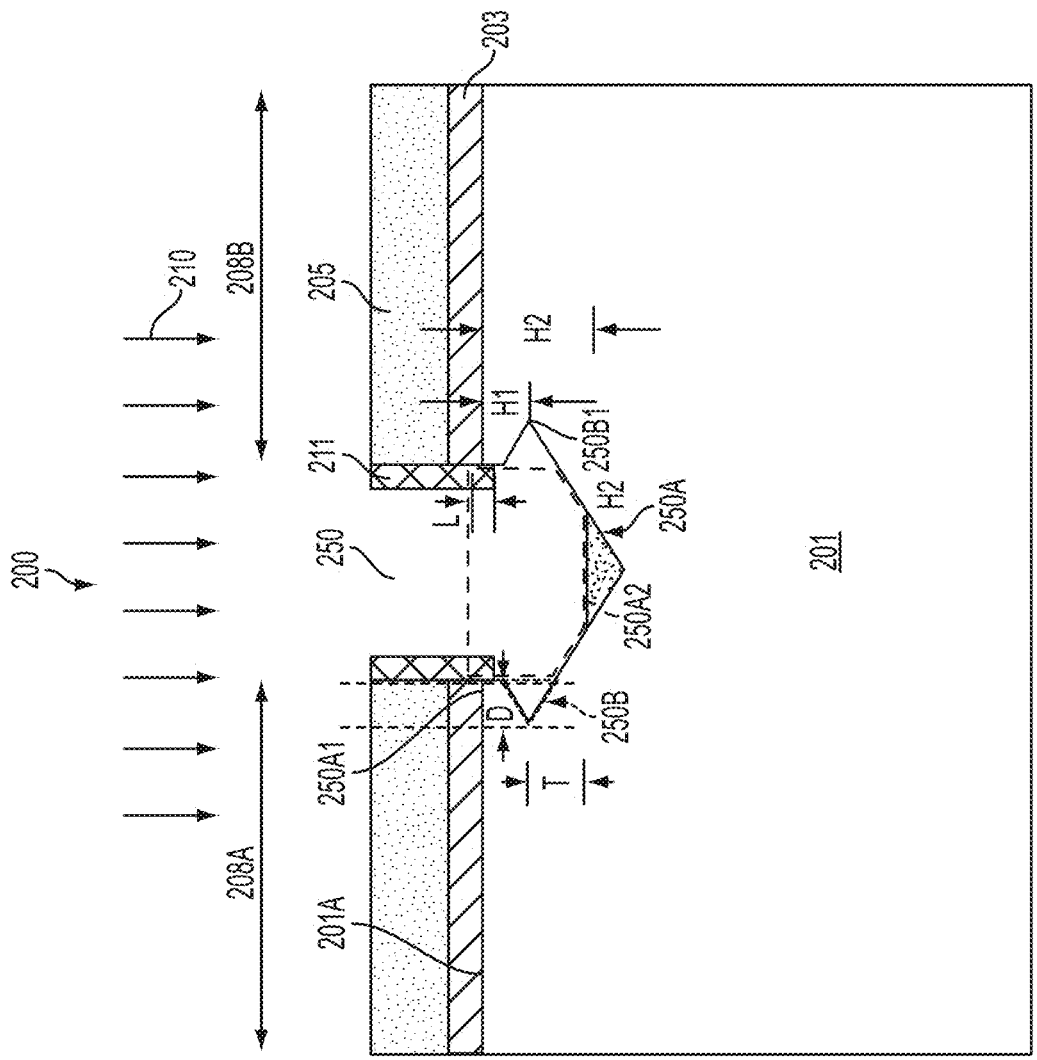
Figure 1E:
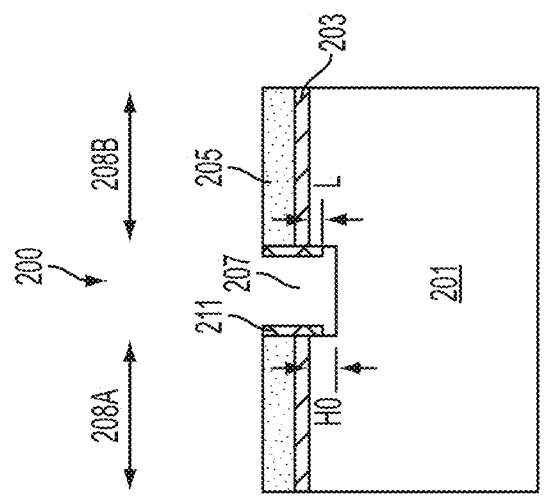

Referring to FIG. 1E, the sacrificial material 209 is selectively removed, and the dielectric liner 211 and the masking layer 205 are remained. The bottom portion of the first opening 207 occupied by the sacrificial material 209 is exposed. In some examples, the sacrificial material 209 is removed by a dry etching process such as a reactive ion etching (RIE) process, or a wet etching process.

Referring to FIG. 1F, an etching process 210 is performed to enlarge the first opening 207 to a second opening 250. The second opening 250 includes a first portion 250A and a second portion 250B. The first portion 250A extends from the first surface 201A with a depth $H_2$ into the substrate 201. The depth $H_2$ is deeper than the depth $H_0$. In certain embodiments, the depth $H_2$ is larger than 310 nm. The first portion 250A has an intersection $250A_1$ with the first surface 201. The first portion 250A also has a bottom surface $250A_2$. The first portion 250A has a sidewall surface with the length L extending from the intersection $250A_1$ into the substrate 201. As previously mentioned, the length L is in a range substantially from 200 nm to 300 nm in some embodiments. The second portion 250B extends away from the first portion 250A and underlies one or both of the active regions 208A-B. The second portion 250B has a tip $250B_1$. The tip $250B_1$ is at a depth $H_1$ less than the depth $H_2$ and at a distance D away from the intersection $250A_1$ in a direction parallel to the first surface 201. In some embodiments, the depth $H_1$ is larger than 285 nm. In some embodiments, the distance D is larger than 25 nm. In some embodiments, a distance T from the tip $250B_1$ of the second portion 250B to a bottom surface of the first portion 250A is larger than 20 nm.

In certain examples as illustrated in FIG. 1F, the etching process 210 is an anisotropic wet etching process that removes silicon at orientation plane dependent rates. The anisotropic wet etching process provides a crystallographically anisotropic etch behavior, which the removal rate in at least one crystallographical orientation may be significantly reduced compared to one or more other crystallographical orientations. In at least one example, a wet etching solution including tetra methyl ammonium hydroxide (TMAH) at about 2.5% by weight is used to etch the substrate 201. The anisotropic wet etching process laterally etches the substrate 201 to form the second portion 250B of the second opening 250 and also vertically etches the substrate 201 to deepen the first opening 207 into the first portion 250A of the second opening 250.

In some examples, the etching process 210 is an isotropic dry etching process with substantially equal vertical and horizontal etch rates to form the second portion 250B of the second opening 250 in a direction parallel to the first surface 201 and form the first portion 250A of the second opening 250 in a direction vertical to the first surface 201. An etchant of the dry etching process includes $NF_3$, $Cl_2$, $SF_6$, He, Ar or $CF_4$.

In at least one example, an implantation process is performed through the opening 207 into the substrate 201 before the etching process 210. The implantation process introduces impurities such as boron into the substrate 201. The impurities may lower an etching rate of the etching process 210 of the substrate 201 and help to accurately control the depth $H_2$ of the second opening 250.

The dielectric liner 211 is removed after the formation of the second opening 250 by a dry etching process, or a wet etching process.

Figure 1H:
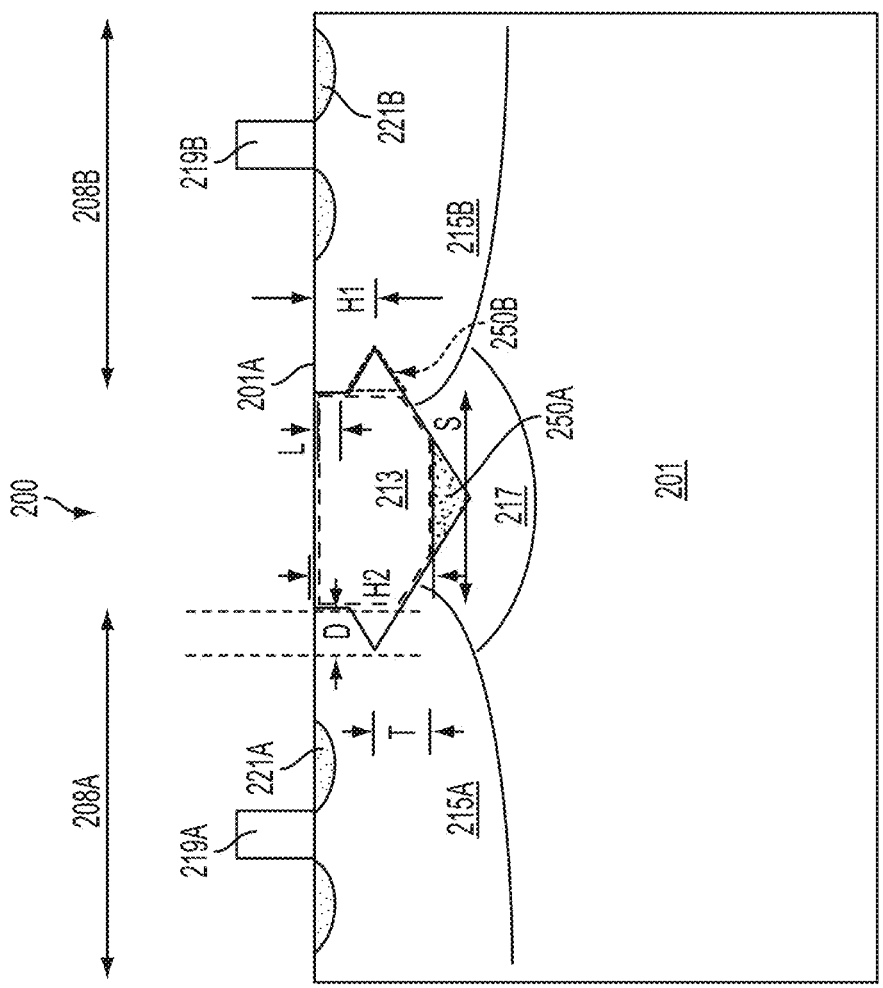
Figure 1G:
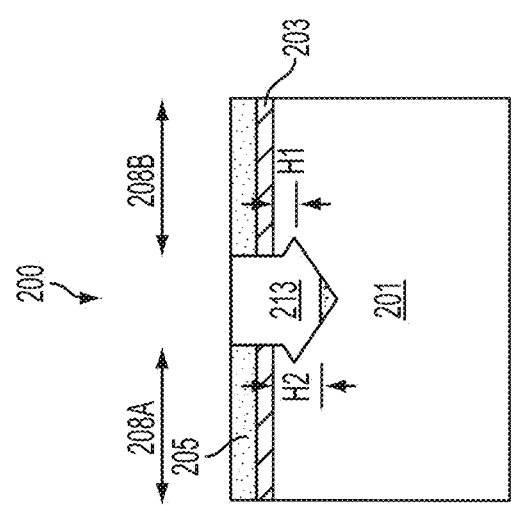

Referring to FIG. 1G, the first portion 250A and the second portion 250B of the second opening 250 are filled with at least one dielectric material to form a shallow trench isolation (STI) structure 213. The at least one dielectric material may comprise silicon oxide, silicon nitride, silicon oxynitride, fluoride-doped silicate glass (FSG), other suitable insulating materials, and/or combinations thereof. In certain examples, the second opening 250 is filled with two dielectric materials with different compositions. In some examples, the second opening 250 is filled with a dielectric material with different methods for bottom and top sections of the second opening 250. The bottom section of the second opening 250 may be filled by a flowable silicon oxide using a spin dielectric (SOD) such as silicate. The flowable silicon oxide is capable of filling the narrow and deep gaps and prevents voids in the second opening 250. The top section of the second opening 250 may be filled by high density plasma (HDP) CVD oxide layer. The dielectric material in the top section of the second opening 250 and the dielectric material in bottom section of the second opening 250 have different density and different etching resistances.

After the at least one dielectric material overfilling the second opening 250 and the masking layer 105, the excess dielectric material outside the second opening 250 and the masking layer 105 is removed through a planarization process such as chemical mechanical polishing (CMP) or an etch process. The shallow trench isolation (STI) structure 213 is formed in the first portion 250A and the second portion 250B of the second opening 250.

Further process steps may be performed to remove the excess at least one dielectric material of the STI structure 213, the masking layer 105 and the pad dielectric layer 203 to expose the first surface 201A of the active regions 208A-B.

Referring to FIG. 1H, doped regions 215A and 215B are formed in the active regions 208A and 208B, respectively. The doped regions 215A and 215B act as well regions for the active regions 208A-B for transistors formation. In the illustrated example, the substrate 201 is a p-type substrate. P-type dopants that the substrate 201 is doped with include boron, gallium, indium, other suitable p-type dopants, or combinations thereof. The doped regions 215A and 215B have n-type conductivity, which is opposite to the substrate 201. The n-type dopants for the doped regions 215A-B may include phosphorus, arsenic, other suitable n-type dopants or combinations thereof. In certain examples, the doped regions 215A-B are formed by implantation processes with the dopants through the first surface 201A into the substrate 201. Advantageously, the second portion 250B of the STI structure 213 extends laterally underlying the active regions 208A-B and blocks some dopants penetrating through the STI structure 213 into portions of the doped regions 215A-B underlying the second portion 250B. With the distance D and the depth $H_1$ of the second portion 250B as the previously mentioned values, the doped regions 215A and 215B are separated with a larger space S compared with structures in accordance with other approaches. The examples in this disclosure prevent carriers, such as electrons or electron-holes, from drifting between two adjacent active regions 208A-B through the space S in the substrate 201 to cause a current leakage. The electrical performances of the semiconductor structure 200 are improved.

The semiconductor structure 200 further includes an isolation doped region 217 formed underlying the first portion 205A of the STI structure 213 and between the doped regions 215A-B. In this illustrated example, the isolation doped region 217 has p-type conductivity, which is opposite to the doped regions 215A-B. P-type dopants that the substrate 201 is doped with include boron, gallium, indium, other suitable p-type dopants, or combinations thereof. The isolation doped region 217 further prevents carriers drifting between two adjacent active regions 208A-B through the space S in the substrate 201.

The semiconductor structure 200 further includes metal-oxide semiconductor (MOS) transistors formation on the active regions 208A-B. In this illustrated example, p-channel MOS (PMOS) transistors are formed on the active regions 208A-B. The PMOS transistor in the active regions 208A includes a gate stack 219A and source/drain regions 221A having p-type conductivity formed in the n-type well 215A. Likewise, the PMOS transistor in the active regions 208B includes a gate stack 219B and source/drain regions 221B having p-type conductivity formed in the n-type well 215B. In some examples, the gate stacks 219A and 219B include silicon gate electrodes and oxide gate dielectric layers. The material of silicon gate electrodes includes single crystal silicon, polycrystalline silicon or amorphous silicon.

In certain examples, the gate stacks 219A and 219B include high-k metal gate electrodes and high-k dielectric layers. In some embodiments, the material of high-k metal gate electrode includes a p-metal layer and a conductive material layer. The p-metal includes a metal-based material having a work function compatible to form P-type transistor. For one example, the p-metal has a work function of about or greater than about 5.2 eV. In some embodiments, the p-metal includes titanium nitride (TiN), tantalum nitride (TaN), tungsten nitride (WN), titanium aluminum (TiAl), or combinations thereof. In certain embodiments, the material of high-k metal gate electrode includes an n-metal layer and a conductive material layer. The n-metal has a work function of about or less than about 4.2 eV. The high-k dielectric layer may include hafnium oxide, hafnium silicon oxide, hafnium silicon oxynitride, hafnium tantalum oxide, hafnium titanium oxide, hafnium zirconium oxide or other suitable high-k dielectric materials.

This disclosure is not limited to the above conditions for forming a STI structure 213 between adjacent PMOS transistors, different conditions that compatible to form adjacent active regions for components of semiconductor devices are within the scope of this disclosure. In various examples, the doped regions including p-type conductivity regions and/or n-type conductivity regions can be configured respectively depending on design considerations.

An aspect of this description relates to a method of forming a semiconductor structure. The method includes forming a first opening in a substrate having a first surface, wherein the first opening extends from the first surface into the substrate, and the first opening is between a first active region and a second active region. The method further includes performing an etching process to enlarge the first opening to a second opening. The second opening includes a first portion extending from the first surface to a first depth into the substrate, the first portion having a sidewall surface perpendicular to the top surface, and a maximum depth of the sidewall surface is less than the first depth; and a second portion extending away from the first portion toward the first active region, the second portion having a tip at a second depth less than the first depth. The method further includes filling the first portion and the second portion of the second opening with at least one dielectric material to form a shallow trench isolation (STI) structure. The method further includes implanting a first dopant having a first conductivity type into the substrate to define a first doped region on a first side of the STI structure, wherein the first doped region directly contacts the first portion and the second portion. The method further includes implanting a second dopant having a second conductivity type into the substrate to define a second doped region in the substrate on a second side of the STI structure opposite the first side. The method further includes implanting a third dopant having a third conductivity type into the substrate to define a third doped region in the substrate under the STI structure and directly contacting the first doped region and the second doped region, wherein a maximum depth of the third doped region is greater than a maximum depth of the first doped region and a maximum depth of the second doped region, the third doped region contacts at least two sidewalls of the STI structure, and sidewalls of the second portion above the tip are free of the third doped region. The third conductivity type is different from the first conductivity type and the second conductivity type, and at least two sidewalls of the STI structure are each covered by two doped regions with different conductivity types. In some embodiments, the method further includes forming a dielectric liner over a sidewall surface of the first opening before performing the etching process to enlarge the first opening. In some embodiments, the dielectric liner extends into the substrate with a length in a range substantially from 200 nm to 300 nm.

An aspect of this description relates to a method of forming a semiconductor structure. The method includes depositing a mask layer over a substrate. The method further includes etching the substrate using the mask layer to define a first opening in the substrate. The method further includes depositing a sacrificial material in a bottom surface of the first opening. The method further includes depositing a dielectric liner along sidewalls of the first opening, wherein a bottom surface of the dielectric liner contacts the sacrificial material. The method further includes removing the sacrificial material. The method further includes etching the substrate exposed by the dielectric liner to enlarge the first opening to define a second opening. The second opening includes a first portion extending a first depth from the dielectric material in a first direction perpendicular to a top surface of the substrate, and a second portion extending in a second direction, parallel to the top surface of the substrate, from the first portion. The method further includes removing the dielectric liner. The method further includes filling the second opening with a dielectric material. In some embodiments, etching the substrate to define the second opening includes performing an anisotropic etching process. In some embodiments, etching the substrate to define the second opening includes performing an isotropic etching process. In some embodiments, the method further includes doping the substrate through the first opening following removal of the sacrificial material. In some embodiments, the method further includes implanting dopants into the substrate on opposite sides of the second opening to form a first doped region and a second doped region. In some embodiments, the method further includes implanting dopants into the substrate below the second opening to form a third doped region, wherein the third doped region directly contacts both the first doped region and the second doped region. In some embodiments, depositing the sacrificial material includes depositing the sacrificial material having a different etch selectivity from the mask layer. In some embodiments, etching the substrate to define the second opening includes defining the second opening have a bottom surface parallel to the top surface of the substrate. In some embodiments, the method further includes forming a first gate stack on a first side of the second opening; and forming a second gate stack on a second side of the second opening opposite the first side of the second opening.

An aspect of this description relates to a method of forming a semiconductor structure. The method includes etching a substrate to define a first opening in the substrate, wherein the first opening has a first depth measured from a top surface of the substrate to a bottom surface of the first opening in a first direction perpendicular to the top surface of the substrate. The method further includes depositing a sacrificial material in on the bottom surface of the first opening, wherein the sacrificial material exposes a portion of sidewalls of the substrate. The method further includes depositing a dielectric liner along the portion of the sidewalls. The method further includes removing the sacrificial material. The method further includes etching the substrate through a space defined by the dielectric liner to enlarge the first opening to define a second opening. The second opening includes a first portion extending a second depth greater than the first depth, wherein the second depth is measured from the top surface of the substrate to a bottom surface of the first opening in the first direction, and a second portion extending in a second direction, parallel to the top surface of the substrate, from the first portion, wherein the second portion defines a tip at a third depth in the substrate, and the third depth is measured from the top surface of the substrate to the tip in the first direction. The method further includes removing the dielectric liner to expose the portions of the sidewalls of the substrate. The method further includes filling the second opening with a dielectric material. In some embodiments, the method further includes implanting dopants into the substrate through the space define by the dielectric liner. In some embodiments, etching the substrate to define the second opening includes defining the second depth to be greater than 310 nanometers (nm). In some embodiments, etching the substrate to define the first opening includes defining the first depth to be from 20 nm to 300 nm. In some embodiments, removing the dielectric liner includes exposing the portions of the sidewalls of the substrate extending in the first direction. In some embodiments, etching the substrate to define the second opening includes defining angled sidewalls in the substrate, the angled sidewalls extend in a third direction, and the third direction is angled with respect to both the first direction and the second direction. In some embodiments, etching the substrate to define the second opening includes defining the angled sidewalls along a crystallographic plane of the substrate. In some embodiments, the method further includes forming a first gate stack on a first side of the second opening; and forming a second gate stack on a second side of the second opening opposite the first side of the second opening.

The present disclosure also describes an aspect of a method of forming a semiconductor structure including a shallow trench isolation (STI) structure. The method includes forming a first opening in a substrate having a first surface. The first opening is formed extending from the first surface into the substrate. An etching process is performed to enlarge the first opening to a second opening. The second opening includes a first portion and a second portion. The first portion extends from the first surface with a depth into the substrate, and has an intersection with the first surface. The second portion extends away from the first portion, and has a tip at a distance away from the intersection in a direction parallel to the first surface. The first portion and the second portion of the second opening are filled with at least one dielectric material to form a STI structure.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming a semiconductor structure, the method comprising:
    forming a first opening in a substrate having a first surface, wherein the first opening extends from the first surface into the substrate, and the first opening is between a first active region and a second active region;
    performing an etching process to enlarge the first opening to a second opening, the second opening comprising:
        a first portion extending from the first surface to a first depth into the substrate, the first portion having a sidewall surface perpendicular to the top surface, and a maximum depth of the sidewall surface is less than the first depth; and
        a second portion extending away from the first portion toward the first active region, the second portion having a tip at a second depth less than the first depth;
    filling the first portion and the second portion of the second opening with at least one dielectric material to form a shallow trench isolation (STI) structure;

implanting a first dopant having a first conductivity type into the substrate to define a first doped region on a first side of the STI structure, wherein the first doped region directly contacts the first portion and the second portion;

implanting a second dopant having a second conductivity type into the substrate to define a second doped region in the substrate on a second side of the STI structure opposite the first side; and implanting a third dopant having a third conductivity type into the substrate to define a third doped region in the substrate under the STI structure and directly contacting the first doped region and the second doped region, wherein a maximum depth of the third doped region is greater than a maximum depth of the first doped region and a maximum depth of the second doped region, the third doped region contacts at least two sidewalls of the STI structure, and sidewalls of the second portion above the tip are free of the third doped region, wherein the third conductivity type is different from the first conductivity type and the second conductivity type, and at least two sidewalls of the STI structure are each covered by two doped regions with different conductivity types.

2. The method of claim 1, further comprising:
forming a dielectric liner over a sidewall surface of the first opening before performing the etching process to enlarge the first opening.

3. The method of claim 2, wherein the dielectric liner extends into the substrate with a length in a range substantially from 200 nm to 300 nm.

4. A method of forming a semiconductor structure, the method comprising:
depositing a mask layer over a substrate;
etching a first surface of the substrate using the mask layer to define a first opening in the substrate, wherein a bottommost surface of the opening exposes a second surface of the substrate;
depositing a sacrificial material in a bottom surface of the first opening, wherein a distance between a top-most surface sacrificial material and the first surface of the substrate is less than a distance between the first surface of the substrate and the second surface of the substrate;
depositing a dielectric liner along sidewalls of the first opening, wherein a bottom surface of the dielectric liner contacts the sacrificial material;
removing the sacrificial material;
etching the substrate exposed by the dielectric liner to enlarge the first opening to define a second opening, wherein the second opening comprises:
a first portion extending a first depth from the dielectric material in a first direction perpendicular to a top surface of the substrate, and
a second portion extending in a second direction, parallel to the top surface of the substrate, from the first portion;
removing the dielectric liner; and
filling the second opening with a dielectric material.

5. The method of claim 4, wherein etching the substrate to define the second opening comprises performing an anisotropic etching process.

6. The method of claim 4, wherein etching the substrate to define the second opening comprises performing an isotropic etching process.

7. The method of claim 4, further comprising doping the substrate through the first opening following removal of the sacrificial material.

8. The method of claim 4, further comprising implanting dopants into the substrate on opposite sides of the second opening to form a first doped region and a second doped region.

9. The method of claim 8, further comprising implanting dopants into the substrate below the second opening to form a third doped region, wherein the third doped region directly contacts both the first doped region and the second doped region.

10. The method of claim 4, wherein depositing the sacrificial material comprises depositing the sacrificial material having a different etch selectivity from the mask layer.

11. The method of claim 4, wherein etching the substrate to define the second opening comprises defining the second opening have a bottom surface parallel to the top surface of the substrate.

12. The method of claim 4, further comprising:
forming a first gate stack on a first side of the second opening; and
forming a second gate stack on a second side of the second opening opposite the first side of the second opening.

13. A method of forming a semiconductor structure, the method comprising:
etching a substrate to define a first opening in the substrate, wherein the first opening has a first depth measured from a top surface of the substrate to a bottom surface of the first opening in a first direction perpendicular to the top surface of the substrate;
depositing a sacrificial material in on the bottom surface of the first opening, wherein the sacrificial material exposes a portion of sidewalls of the substrate;
depositing a dielectric liner along the portion of the sidewalls after depositing the sacrificial material;
removing the sacrificial material;
etching the substrate through a space defined by the dielectric liner to enlarge the first opening to define a second opening, wherein the second opening comprises:
a first portion extending a second depth greater than the first depth, wherein the second depth is measured from the top surface of the substrate to a bottom surface of the first opening in the first direction, and
a second portion extending in a second direction, parallel to the top surface of the substrate, from the first portion, wherein the second portion defines a tip at a third depth in the substrate, and the third depth is measured from the top surface of the substrate to the tip in the first direction;
removing the dielectric liner to expose the portions of the sidewalls of the substrate; and
filling the second opening with a dielectric material.

14. The method of claim 13, further comprising implanting dopants into the substrate through the space define by the dielectric liner.

15. The method of claim 13, wherein etching the substrate to define the second opening comprises defining the second depth to be greater than 310 nanometers (nm).

16. The method of claim 13, wherein etching the substrate to define the first opening comprises defining the first depth to be from 20 nm to 300 nm.

17. The method of claim 13, wherein removing the dielectric liner comprises exposing the portions of the sidewalls of the substrate extending in the first direction.

18. The method of claim 17, wherein etching the substrate to define the second opening comprises defining angled sidewalls in the substrate, the angled sidewalls extend in a third direction, and the third direction is angled with respect to both the first direction and the second direction.

19. The method of claim 18, wherein etching the substrate to define the second opening comprises defining the angled sidewalls along a crystallographic plane of the substrate.

20. The method of claim 13, further comprising:
   forming a first gate stack on a first side of the second opening; and
   forming a second gate stack on a second side of the second opening opposite the first side of the second opening.

\* \* \* \* \*